United States Patent
Wessels et al.

(10) Patent No.: US 7,964,054 B2
(45) Date of Patent: Jun. 21, 2011

(54) METHOD OF APPLYING A MATERIAL ON A SUBSTRATE

(75) Inventors: Jurina Wessels, Stuttgart (DE); Akio Yasuda, Suginami-ku (JP); Daniel Schwaab, Eitorf (DE); Dirk Mayer, Frechen (DE); Andreas Offenhaeusser, Eynatten (BE)

(73) Assignees: Sony Deutschland GmbH, Berlin (DE); Forschungszentrum Juelich GmbH, Juelich (DE)

( * ) Notice: Subject to any disclaimer, the term of this patent is extended or adjusted under 35 U.S.C. 154(b) by 255 days.

(21) Appl. No.: 12/301,093

(22) PCT Filed: Jun. 15, 2007

(86) PCT No.: PCT/EP2007/005310
§ 371 (c)(1),
(2), (4) Date: Nov. 17, 2008

(87) PCT Pub. No.: WO2008/014845
PCT Pub. Date: Feb. 7, 2008

(65) Prior Publication Data
US 2009/0183831 A1    Jul. 23, 2009

(30) Foreign Application Priority Data

Aug. 4, 2006   (EP) .................................. 06016355

(51) Int. Cl.
*B29C 65/00* (2006.01)
*B31B 1/60* (2006.01)
*B32B 37/00* (2006.01)
*F16G 5/00* (2006.01)

(52) U.S. Cl. .......... 156/285; 156/60; 156/381; 156/140; 156/286; 156/287; 156/382

(58) Field of Classification Search ................ 156/285, 156/60, 381, 140, 286, 287, 382
See application file for complete search history.

(56) References Cited

U.S. PATENT DOCUMENTS

| | | | |
|---|---|---|---|
| 5,816,158 A | 10/1998 | Ross | |
| 5,947,027 A * | 9/1999 | Burgin et al. ................. | 101/474 |
| 6,458,426 B1 | 10/2002 | Bulovic et al. | |
| 2002/0101460 A1 | 8/2002 | Miyauchi et al. | |
| 2003/0159608 A1 | 8/2003 | Heidari | |
| 2005/0145119 A1 * | 7/2005 | Tan et al. ....................... | 101/3.1 |
| 2005/0224452 A1 | 10/2005 | Spiess et al. | |
| 2006/0065143 A1 | 3/2006 | Sakurai et al. | |

FOREIGN PATENT DOCUMENTS

| | | |
|---|---|---|
| EP | 0 492 258 | 7/1992 |
| EP | 1 229 387 | 8/2002 |
| EP | 1 244 939 | 8/2006 |
| JP | 6 89858 | 3/1994 |
| WO | 03 087935 | 10/2003 |
| WO | 2005 109095 | 11/2005 |

* cited by examiner

Primary Examiner — Khanh Nguyen
Assistant Examiner — Matthew Hoover
(74) Attorney, Agent, or Firm — Oblon, Spivak, McClelland, Maier & Neustadt, L.L.P.

(57) ABSTRACT

A method of applying material on a substrate. The material to be applied can be a pattern of material.

31 Claims, 11 Drawing Sheets

METHOD OF APPLYING A MATERIAL ON A SUBSTRATE

BACKGROUND OF THE INVENTION

I. Field of the Invention

The present invention relates to a method of applying a material, preferably a pattern of material on a substrate.

II. Discussion of the Background

During the past decade, soft lithography has developed to a versatile technique for fabricating chemically micro- and nanostructured surfaces [1,2]. Among several techniques known collectively as soft lithography, micro contact printing (μCP) has become the most commonly used method [1]. The technique was initially developed for the transfer of organic molecules [3], but later on also widely used for the transfer of biomolecules such as proteins [4].

Initially polydimethylsiloxane (PDMS) was used as stamp materials in μCP. As a result of the small Young's Modulus conformal contact between the stamp and the target substrate, a prerequisite for the successful pattern transfer, are easily achieved. The drawbacks of soft materials, however, are deformations known as pairing, buckling, sagging or a complete collapse of patterns [5]. PDMS has a Young's modulus of approximately 1 MPa and hence, does not allow to transfer patterns with dimensions below 200 nm. Other PDMS mixtures were investigated to make it harder and thus increase the resolution [6]. The so-called h-PDMS has got a Young's modulus around 8 MPa, enabling the transfer of quadratic patterns with feature sizes down to 80 nm. Line structures with these critical dimensions could not be demonstrated. In addition, even harder materials such as polyolefines, e.g. Affinity [7] or block copolymers SBS (poly(sterene-block-butadiene-block-styrene) or SEBS (poly(styrene-block-ethylene-co-butylene-block-styrene)) [8] were investigated. Their Young's modulus is around 45 MPa and allows the transfer of 100 nm lines. However, the quality of the transfer patterns suffers from sagging effects.

Another field of transfer methods used for the transfer of metals and other solids such as CNTs is nanotransfer printing (nTP) [9,10]. There a thin layer of metal is evaporated onto a patterned elastomeric stamp, which has been fabricated by drop casting of polydimethylsiloxane (PDMS) onto a patterned Si wafer. The evaporated metal layer is brought in conformal contact with an organic layer on a substrate. As a result of the chemical bond formation at the metal-organic interface, the metal-organic adhesion is stronger than the metal-PDMS adhesion and the metal layer is transferred from the PDMS stamp onto the organic layer. The transfer of metal by nanotransfer printing suffers from the same drawbacks of soft stamps as microcontact printing.

The preparation of polymer stamps and subsequent micrcontact printing technique of organic and inorganic structures have been developed. Critical for a good pattern transfer is the conformal contact between the substrate and the stamp. Polymers with different Young's modulus have been used to transfer patterns of organic molecules (proteins and alkanethiols) and inorganic materials with critical dimensions down to ~75 nm over small areas. For the transfer of patterns with critical dimensions below 100 nm hard substrate and hard stamp materials, at least as far as their contacting surfaces are concerned, are required.

U.S. Pat. No. 6,482,742 [1] and Tan et al. [12], disclose a method of imprint lithography involving the use of fluid pressure to press a mould into a substrate-supported film. According to this method, the mould and/or substrate are sufficiently flexible to provide wide area contact under the fluid pressure. It is emphasized that both substrates and moulds need to have sufficient flexibility and pliability to be used in this method.

However, none of the prior art processes allows and ensures the achievement of a conformal contact between hard surfaces. Accordingly, it was an object of the present invention to provide for a method that can be adapted to the use of hard surfaces within printing processes. Moreover, it was an object of the present invention to provide for a method which allows the usage of hard surfaces so as to enable a transfer of materials, preferably patterned materials with dimensions $\leq$30 nm. It has also been an object of the present invention to provide for a method that ensures uniform printing over large areas.

SUMMARY OF THE INVENTION

The objects of the present invention are solved by a method of applying a material, preferably a pattern of material, on a substrate, comprising the steps:
a) providing a first substrate having a first surface,
b) providing a second substrate having a second surface, preferably a patterned surface, said second substrate having a Young's modulus $\geq$100 MPa,
c) providing material, to be applied, preferably patterned on said first surface, and applying said material on said second surface,
d) producing an assembly of said first substrate and said second substrate by bringing said first surface in contact with said second surface, with said material being sandwiched between said surfaces, said assembly comprising a volume arranged between said first and said second substrate,
e) applying first pressure conditions on said assembly thereby establishing first pressure conditions in said volume, and
f) sealing said volume,
g) applying second pressure conditions on said assembly, wherein said second pressure conditions involve a higher pressure than said first pressure conditions, such that said first surface is brought into conformal contact with said second surface, thereby applying said material, preferably a pattern of said material on said first surface.

In a preferred embodiment, it is said second surface which has a Young's modulus $\geq$100 MPa.

Preferably, the method according to the present invention, further comprises the steps:
h) applying third pressure conditions on said assembly, wherein said third pressure conditions are different to said second pressure conditions,
i) unsealing said volume, and
g) removing said second substrate from said assembly.

Preferably, said second surface is a patterned surface having a pattern of protrusions and/or recesses.

In one embodiment said second pressure conditions are applied on said assembly by means of a chamber capable of being evacuated and/or pressurized, wherein, for application of said second pressure conditions, said chamber is pressurized, whilst said assembly is located in said chamber.

In one embodiment said first pressure conditions are atmospheric or ambient pressure or a pressure below atmospheric or ambient pressure, preferably 0.1 mbar to 900 mbar, more preferably 100 mbar to 500 mbar.

Preferably, said third pressure conditions are atmospheric or ambient pressure or a pressure below atmospheric or ambient pressure.

In one embodiment said second pressure conditions involve a higher pressure than said first and third pressure conditions, wherein, preferably, said first and third pressure conditions are the same and involve atmospheric or ambient pressure or a pressure below atmospheric or ambient pressure.

In another embodiment said first and third pressure conditions are not the same and said third pressure conditions involve a higher pressure than said first pressure conditions, wherein said third pressure conditions involve atmospheric or ambient pressure and said first pressure conditions involve a pressure below atmospheric or ambient pressure.

In one embodiment said first pressure conditions involve a pressure below atmospheric or ambient pressure, and wherein said first pressure conditions are applied on said assembly by means of a chamber capable of being evacuated and/or pressurized, wherein, for application of said first pressure conditions, said chamber is evacuated, whilst said assembly is located in said chamber, wherein, preferably, said chamber is the chamber used for application of said second pressure conditions.

In one embodiment said third pressure conditions involve atmospheric or ambient pressure and wherein said third pressure conditions are applied on said assembly by means of a chamber capable of being evacuated and/or pressurized, wherein, for application of said third pressure conditions, said chamber is evacuated to atmospheric or ambient pressure, whilst said assembly is located in said chamber, wherein, preferably, said chamber is the chamber used for application of said second and/or said first pressure conditions.

In one embodiment said second pressure conditions involve the application of a pressure higher than atmospheric pressure, wherein, preferably, said second pressure conditions involve the application of a pressure in the range of from 2 bar to 100 bar, more preferably from 2 bar to 42 bar.

In one embodiment, said second pressure conditions are applied over a period of from 5 s to 60 min.

In one embodiment said second pressure conditions involve the increase of pressure up to a maximum pressure in the range of from 2 bar to 100 bar, more preferably from 2 bar to 42 bar.

In one embodiment, said maximum pressure is maintained over a period of from 10 s to 59 min.

In one embodiment said second substrate is made of a material having a Young's modulus $\geq$100 MPa which material is selected from the group comprising polymers, metals, semiconductors, crystals, amorphous solids and composites thereof, wherein, preferably, said polymer is selected from the group comprising polyolefines, ionomers, polymethylmethacrylates, polycarbonates, cellulose acetate, polyamide, polyimide, polystyrene, polytetrafluoroethylene, polyoxymethylene and copolymers.

In one embodiment said first substrate is made of a material having a Young's modulus$\geq$100 MPa which material is selected from the group comprising polymers, metals, semiconductors, crystals and composites thereof, wherein, preferably said polymer is selected from the group of thermosetting plastics comprising polyolefines, ionomers, polyethylene-methacrylate-copolymers, polymethylmethacrylate, polycarbonates, cellulose acetate, polyamide, polyimide, polystyrene, polytetrafluoroethylene, polyoxymethylene and copolymers.

In one embodiment said sealing occurs by applying a sealing material to said assembly of said first substrate and said second substrate, to enclose said volume between said first and said second substrate and to isolate said volume from the surroundings of said assembly, wherein, preferably, said sealing material is a sealing ring or a foil enclosing said assembly, or two foils enclosing said assembly.

In one embodiment said second pressure conditions are applied at a temperature in the range of from 0° C. to 200° C., more preferably in the range of from 0° C. to 95° C.

Preferably, steps a) and b) occur in the order ab or ba, or they occur concomitantly.

In one embodiment said material, to be applied, preferably patterned on said first surface, is selected from the group comprising molecules, such as organic molecules, metal complex compounds, proteins; thin films of inorganic solids, nanoparticles, wherein, preferably, said inorganic solids are selected from the group comprising metals, metal oxides, semiconductors; and objects such as viruses.

In one embodiment said material, to be applied, preferably patterned on said first surface, is applied on said second surface by a process selected from contact inking and wet inking.

The present inventors have surprisingly found that subjecting an assembly of two surfaces between which material is to be transferred, to pressures $\geq$2 bar enables the usage of hard surfaces, i.e. substrates which are used as stamps and/or target substrates. This, in turn, allows the transfer of patterns with dimensions $\leq$30 nm. The idea underlying the method according to the present invention is that after bringing substrates into contact with each other, with the material to be transferred in between, a volume is enclosed between the substrate and the stamp for which, in a first step, first pressure conditions are established. In a preferred embodiment, such first pressure conditions are below atmospheric pressure, such as 100 mbar. These first pressure conditions are conserved by sealing and thereby isolating and delimiting the volume between the stamp and the substrate from the surroundings. In a subsequent step, second pressure conditions are established which are higher than said first pressure conditions and which involve pressures up to 100 bar. Such second pressure conditions thereby create a difference to the reference pressure, i.e. said first pressure conditions, which are established and still exist within the volume enclosed by the stamp and the substrate and the seal around it. The second pressure conditions, i.e. the high pressure, is maintained for a defined period of time. It is clear to someone skilled in the art that such second pressure conditions may involve variable pressures and may also involve defined pressure profiles. Typically, second pressure conditions are applied for a period of time in the range of from 5 s to 60 min. Thereafter, the pressure is lowered again, which may be atmospheric pressure or may be the same pressure as those pressure conditions that had been applied and established as reference pressure. These pressure conditions after the high-pressure-step are herein also sometimes referred to as "third pressure conditions". Without wishing to be bound by any theory, the inventors presently believe that by applying high pressure conditions, a uniform printing process is ensured, because, essentially, the pressure conditions act on the assembly of stamp and substrate in a uniform manner. Preferably, the high pressure conditions are applied on the assembly by means of a chamber capable of being evacuated and/or pressurized. Such a chamber is a chamber wherein pressure may be applied by means of the gas or liquid within the chamber. Likewise, a vacuum may be applied by evacuating said chamber of said gas or liquid. Again, the pressure, namely the negative pressure thus created, is uniformly applied on the object within the chamber, e.g. an assembly of a substrate and a stamp. The method according to the present invention ensures that the stamp cannot move with respect to the target substrate. Moreover, the method can be carried out with different printing pressures which may be precisely adjusted. Additionally, even pressure profiles may be performed which may include pressure ramps, i.e. pressure increases as well as pressure declines. The method according to the present invention allows the usage of very hard substrates and/or stamps which, in turn allows the transfer of patterns with dimensions≦30 nm. If, as a stamp, a polymeric material is used, such polymeric stamp may be made in a single step and is simple to fabricate. Moreover, the entire process is defect-tolerant. A dust grain which may, for example, have ended up between the stamp and the substrate only causes a minor area of affected transfer and printing. If a three dimensional stamp pattern is to be printed, the process does not pose high requirements on the uniformity of such three dimensional stamp patterns, as fluctuations in the height may be compensated.

The term "a first substrate", as used herein, usually refers to the target substrate, onto which material is to be applied or printed or patterned. Although the method according to the invention allows for the application of material in general, which does not necessarily need to have a pattern, a preferred embodiment of the method according to the present invention is directed at applying a pattern of material on such first substrate or target substrate. Such first substrate has a first surface which is the surface onto which the material is to be applied, preferably patterned.

The term "a second substrate", as used herein, usually refers to the stamp which is used in the method according to the present invention. In its simplest form, this stamp may have a smooth surface, but preferably it has a patterned surface which is the pattern that is to be applied ultimately to the target substrate. The patterning of said second surface of said second substrate, i.e. of the surface of said stamp can be performed by a number of processes known to the person skilled in the art, such as lithographic methods, etching methods, as disclosed in Nishi [13] and Levinson [14].

The term "an assembly of said first substrate and said second substrate", as used herein, is meant to refer to an arrangement wherein the first substrate, i.e. the target substrate, and the second substrate, i.e. the stamp, have been brought together; and their respective surfaces, i.e. the first surface and the second surface, which are involved in the transfer process have been brought into contact with each other, such that the material that is to be transferred from the stamp to the target substrate is sandwiched between the stamp and the target substrate. The material that is to be applied, preferably patterned on the target substrate is first brought onto the stamp by any process useful for that purpose, such as contact inking or wet inking, or by evaporating the material, e.g. metal, to be applied onto the stamp, or via a shuttle process. Usually, in the inking processes, a stamp, preferably a patterned stamp is covered with an ink of molecules to be applied, preferably patterned on the target substrate. In contact inking, the solvent of the ink is reduced to the dry state while the molecules self assemble on an ink pad. The molecules are transferred onto the stamp under ambient conditions by bringing the stamp and the ink pad into conformal contact. In wet inking, the ink is poured over the stamp and then reduced under a stream of gas, e.g. nitrogen, to a dry state. In both cases, the molecules have been placed onto a stamp prior to the subsequent transfer onto the target substrate. In the assembly of the target substrate and the stamp, a volume is enclosed between the stamp and the target substrate which comprises the material to be applied to said target substrate and, if present, a pattern of protrusions and/or recesses on which the material to be applied on the target substrate, is arranged.

The term "to apply nth (i.e. $1^{st}$, $2^{nd}$, etc.) pressure conditions on said assembly", as used herein, is meant to refer to the application of uniform pressure onto the assembly, such as is for example achieved by adjusting the pressure of the medium surrounding the assembly to a specified value or a range of values. The term may also refer to the performance of a specified pressure profile, in the sense that the pressure of the surrounding medium may be increased over a number of steps and/or decreased over a number of steps. Such pressure profiles may be defined according to the needs and requirements of the individual experiment. In its simplest form, however, the term "to apply pressure conditions on said assembly" is meant to refer to the attainment of a specified pressure value and the maintenance of this pressure value for a defined period of time. In the context of the present invention, the "first pressure conditions" that are applied on said assembly serve the purpose of establishing a reference pressure on and within the assembly, most notably in the volume that is enclosed by the stamp and the target substrate. Such reference pressure is preserved by subsequently sealing the volume and isolating it from the surroundings of the assembly. The "second pressure conditions" that are applied on said assembly are the high pressure conditions which serve the purpose of exerting pressure in a uniform manner onto said assembly and to thereby bring the second substrate, i.e. the stamp, and the first substrate, i.e. the target substrate, into conformal contact with each other. The term "to bring into conformal contact with", as used herein, is meant to denote a contact between two entities, e.g. surfaces, allowing the transfer of molecules that were on one entity before the contact, to the other entity. In some embodiments according to the present invention, an exertion of pressure is needed for such transfer to occur, and in these instances, the term "to bring into conformal contact with" may also be equated with "to press on (to)". The "third pressure conditions" which are applied on said assembly, as used herein, refer to the pressure conditions that follow after application of the second, i.e. high, pressure conditions. In its simplest form, such third pressure conditions may be atmospheric or ambient pressure, or they may be a pressure below atmospheric or ambient pressure. The term "to apply nth pressure conditions", as used herein, refers to any process whereby such pressure conditions are applied and exerted on the assembly in a uniform manner, i.e. by adjusting the pressure that the medium surrounding the assembly exerts on said assembly. In a typical embodiment, such application of pressure conditions is achieved by a chamber that may be pressurized or evacuated.

The term "sealing said volume", as used herein, is meant to refer to a process whereby the pressure conditions that have been established within the volume are conserved by isolating the volume from the surroundings. Likewise, the term "unsealing said volume", as used herein is meant to refer to a process wherein such seal is removed, as a result of which the pressure conditions within the volume may equilibrate and attain the same value as the surroundings. The term "pressure conditions involve a certain pressure", (e.g. higher pressure), as used herein, is meant to refer to the fact that such pressure condition may comprise a single pressure value that is maintained for a defined period of time or may comprise a number of pressure values that are attained subsequently. In any case, the term "pressure conditions", as used herein, is meant to imply that whatever pressure value is prevalent at a specific point in time, such pressure value is applied uniformly to the assembly.

The term "Young's modulus" or tensile modulus is meant to define the hardness of a material. The Young's modulus is defined as the ratio of the linear stress to linear strain (in $Nm^{-2}$ or Pa). It is e.g. measured using ASTM D638 or ISO 527.

Sometimes in this application, reference is made to a substrate having a Young's modulus of a specified value. It is preferred that such indication of a Young's modulus refers to those parts of such substrate that are actually involved in the transfer process/printing process, such as the respective surface (first surface, second surface).

In the method according to the present invention, a number of steps are performed which are initiated by a single letter. Unless otherwise indicated, the order in which these steps are performed is the order in which the respective letters appear in the alphabet, that is step "a" occurs before "b" which occurs before step "c" etc. In this respect, it is to be noted that steps "a" and step "b" according to the method of the present invention may occur in the order ab or ba or they occur concomitantly. In this context, the term "concomitantly" is meant to denote a scenario wherein both steps are performed at the same time, i.e. they have the same beginning and end, or there may be an overlap between the two steps. Moreover, it should be noted that steps h and "i" may occur in the order hi or ih or they may occur concomitantly.

In the following, a preferred embodiment of the process is described.

DETAILED DESCRIPTION OF THE INVENTION

Figure 1:
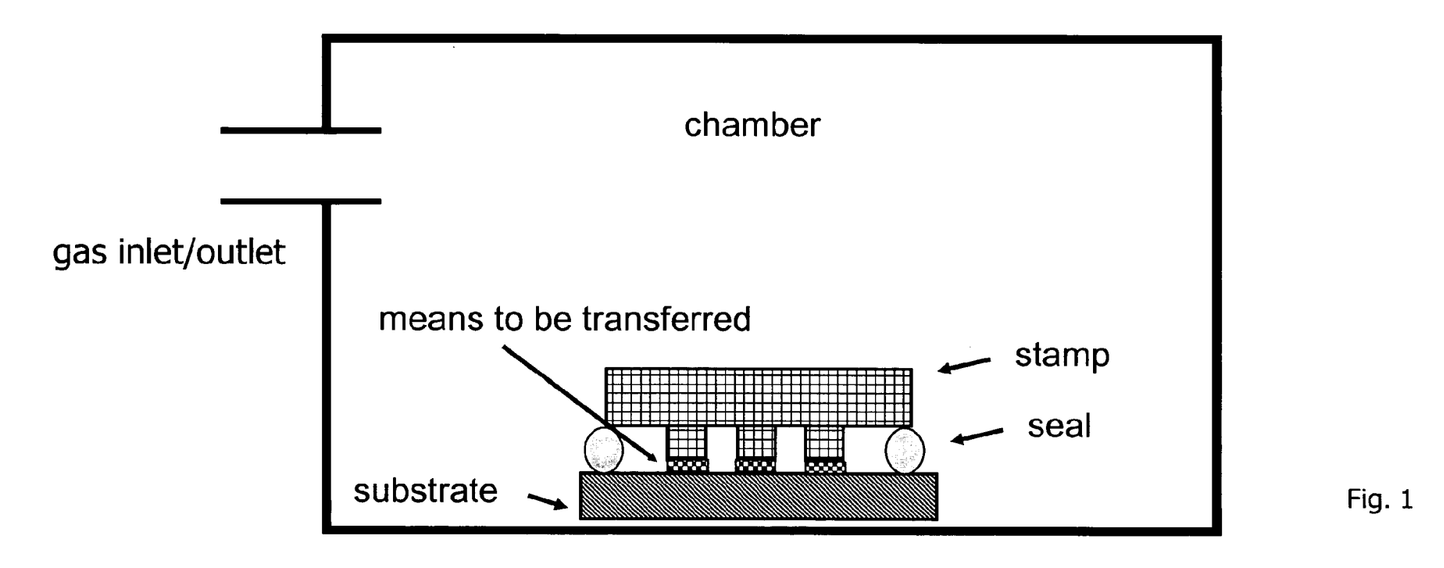
FIG. 1 shows a schematic representation of the Fluid Pressure process.

Process Description of a Preferred Embodiment
Process (See Also FIG. 1):
  The process steps of a preferred embodiment involve
  providing a hard substrate (called target substrate), which should be patterned/covered with molecules
  providing a hard stamp with or without a pattern
  providing sealing material for the encapsulation of the substrate and stamp materials
  providing a chamber which can be evacuated and set under pressure
  evacuating the chamber
  sealing the substrate/stamp interface
  generating a pressure difference between the encapsulated volume and the outer volume in order to generate the conformal contact between substrate and stamp by gaseous pressure
  applying the pressure for a time period t
  bringing the chamber to atmospheric pressure, open the seal and remove the stamp from the substrate
Preferred Materials:
  As substrate any hard surface can be used having dimensions up to 12 in. They could be flat and even, have any other shape or be irregular. They could be pre-patterned with three-dimensional structures or other molecules.
  As stamps any hard materials with a Young's modulus >100 MPa might be used. Ideal candidates are polymeric materials such as thermoplastic materials. But any other solid with the appropriate properties could be used as well.
  Polymeric stamps could be prepared by hot embossing or casting. Other hard stamps could be prepared by means of any other method which is capable of forming three-dimensional patterns. Also unpatterned materials can be used for the transfer. The inking of the stamp could be done by any conventional method such as wet inking or contact inking, or by evaporation or a shuttle process. Any molecular ink could be used. The process can also be applied for the transfer of metals or any other solid material which has got the appropriate properties.
Preferred Process Parameters:
  The major process parameter is the pressure difference between the "high pressure conditions" (i.e. second pressure conditions) and the "low pressure conditions" (i.e. first pressure conditions) between substrate/stamp and chamber. Therefore it is necessary to seal the stamp to the substrate by any useful means.

BRIEF DESCRIPTION OF THE DRAWINGS

Furthermore, in the following reference is made to the figures wherein.

Moreover, reference is made to the following examples which are given to illustrate, not to limit the present invention.

EXAMPLES

For all examples, the transferred patterns shown in the Figures were investigated with scanning electron microscopy.

In these examples the following polymeric materials were used:

| material | class | Young's modulus/MPa | manufacturer |
|---|---|---|---|
| Sylgard 184 | Polydimethylsiloxane | 1-8 | Dow Corning |
| Affinity VP8770 | Polyolefine | 80 | Dow Chemicals |
| Topas 8007 | Polyolefine | 2600 | Topas Advanced Polymers |
| Zeonor 1420R | Polyoelfine | 2400 | Zeon Corp. |
| Zeonex E48R | Polyolefine | 2500 | Zeon Corp. |
| Surlyn 1702 | copolymer | 190 | DuPont |
| Plexiglas 99530 | Methacrylate | 2000 | Roehm, Degussa |

Example 1

A Nanonex NX-2000 tool based on [11,12] was used to perform the process. Therefore a 1 cm by 1 cm silicon-chip covered with a gold layer was used as a substrate. Surlyn 1702 stamps having features with critical dimensions of 5 µm to 75 nm were inked with protein solution of cytochrome c for 2 h using the wet inking method. Afterwards the stamps were dry blown under a stream of nitrogen. The substrate was placed onto a silicone foil. Subsequently the stamp was placed onto the substrate and a second silicone foil mounted in a tenter was placed on top such that the two silicone foils did not touch each other. This assembly was put into the pressure chamber of the NX-2000. Over a time period of 10 s the chamber was evacuated and the residual pressure was 100 mbar. Subsequently the two silicone foils are brought into contact by bringing the tenter in contact with the lower foil. Thus substrate and stamp were sealed against the chamber. The vacuum step is necessary to guarantee a good sealing. A first pressure of 2 bar was filled into the chamber for 15 s. Because stamp and substrate are sealed this exerts a reference pressure onto stamp and substrate. Then the pressure was increased to 25 bar for 1 min. Afterwards the pressure was released and after separating the foils, master and stamp were separated. Due to the sealing of the silicone foils the stamp can not move relative to the substrate during the transfer process. The SEM image (FIG. 2) shows a nice transfer of all features. The coverage of proteins is homogeneous. The patterns fidelity is perfect. The SEM image (FIG. 3) reveals what happens to dust, which might be present on the surface. Due to the uniform pressure only a very small area is affected.

Example 2

Figure 2:
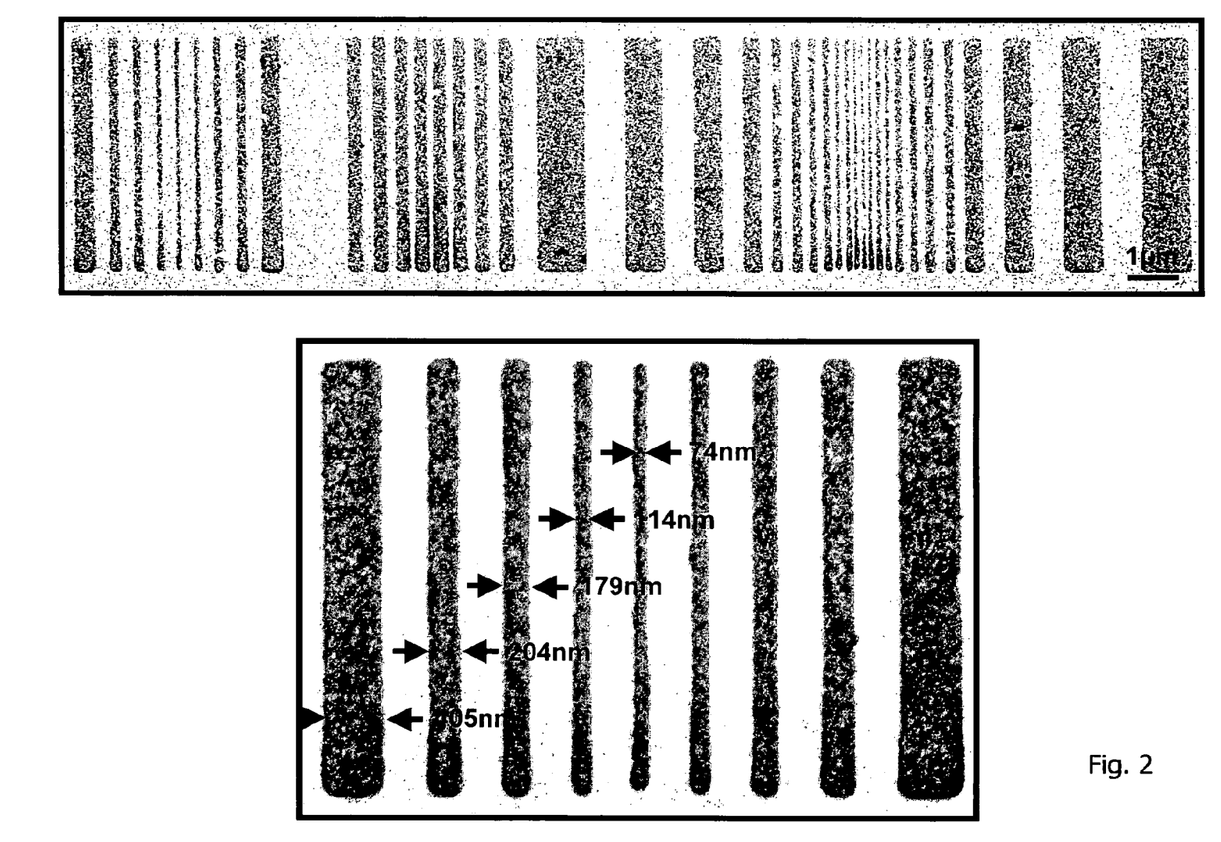
FIG. 2 shows a SEM image of cytochrome c printed with Surlyn at 25 bar.
Figure 3:
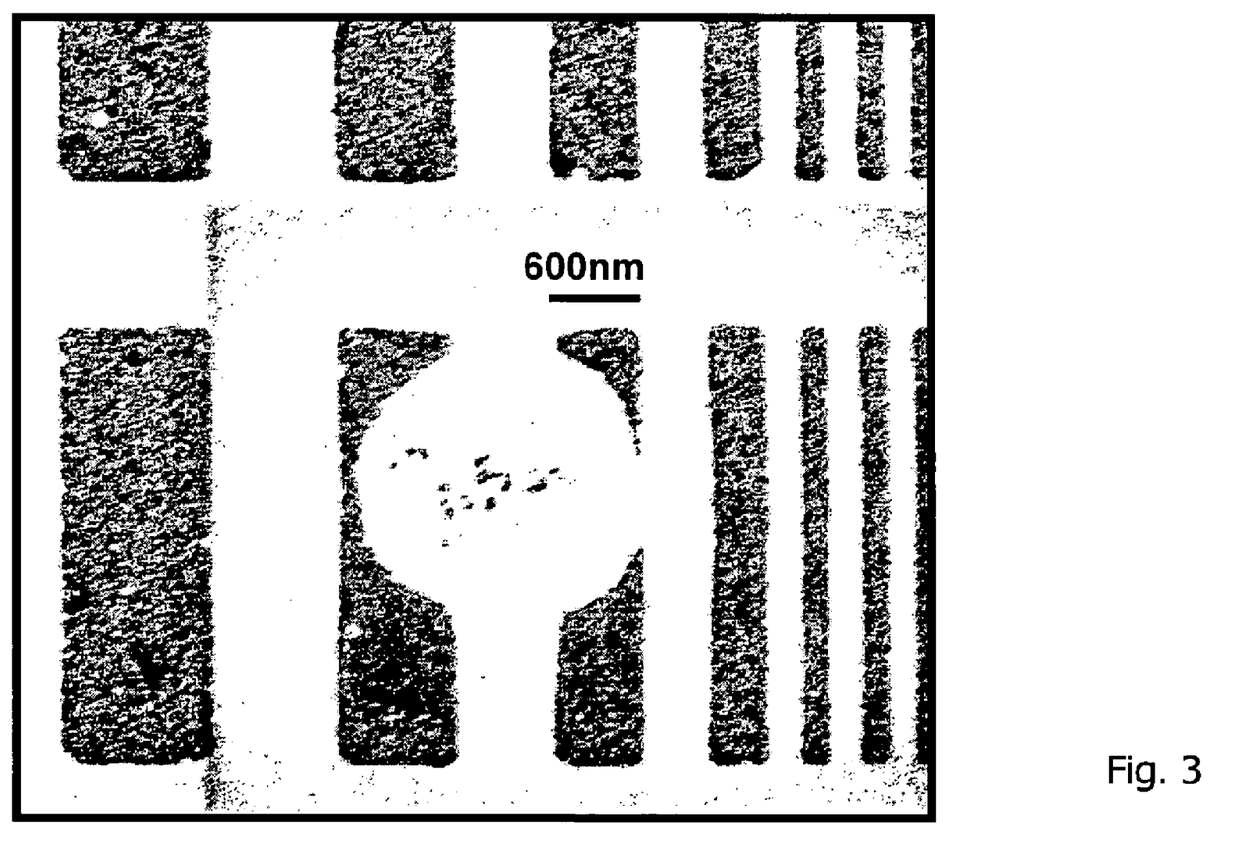
FIG. 3 shows a SEM image of a dust grain within a transferred pattern.
Figure 4:
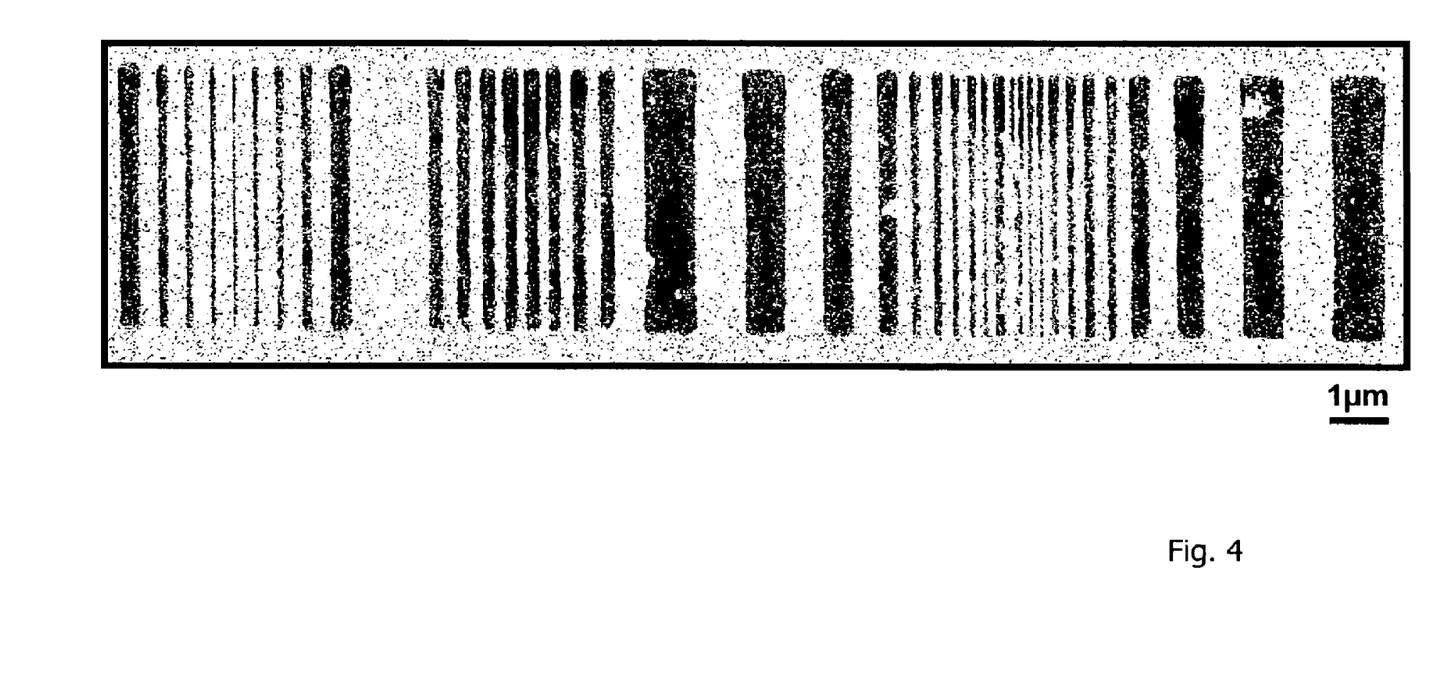
FIG. 4 shows a SEM image of cytochrome c printed with Surlyn at 17 bar.

Like in Example 1 an experiment is performed with Surlyn 1702 applying a maximum pressure of 18 bar. The SEM image (FIG. 4) shows that the transfer is not as perfect as (FIG. 2). This indicates that the quality of the pattern transfer depends on the pressure applied.

Example 3

Figure 5:
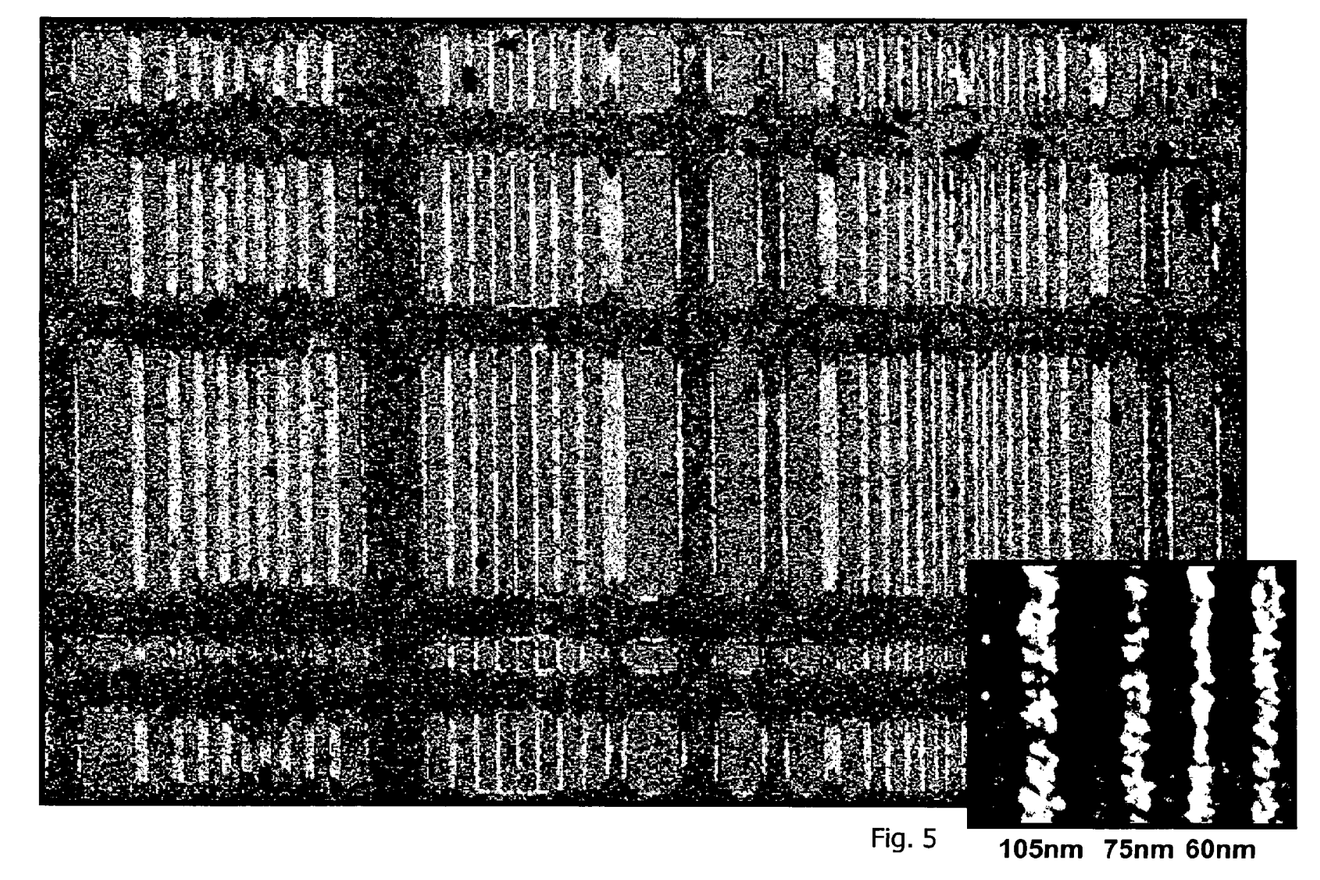
FIG. 5 shows a SEM image of cytochrome c printed with Surlyn at 42 bar.

Like in Example 1 an experiment is performed with Surlyn 1702 applying a maximum pressure of 42 bar. The SEM image (FIG. 5) reveals that some sagging occurred. This indicates that also hard stamp materials are subject to sagging, if the pressure exceeds a critical value. It is envisaged that pressures in the range of from 2 bar to 100 bar, preferably from 2 bar to 42 bar, give good results. In any case, the person skilled in the art will be able to determine the acceptable maximum pressure for any given material by performing a series of experiments using different pressure values. The sagging created sub 60 nm patterns which were not part of the stamp pattern. This effect is known as Overpressure µCP [15].

Example 4

Figure 6:
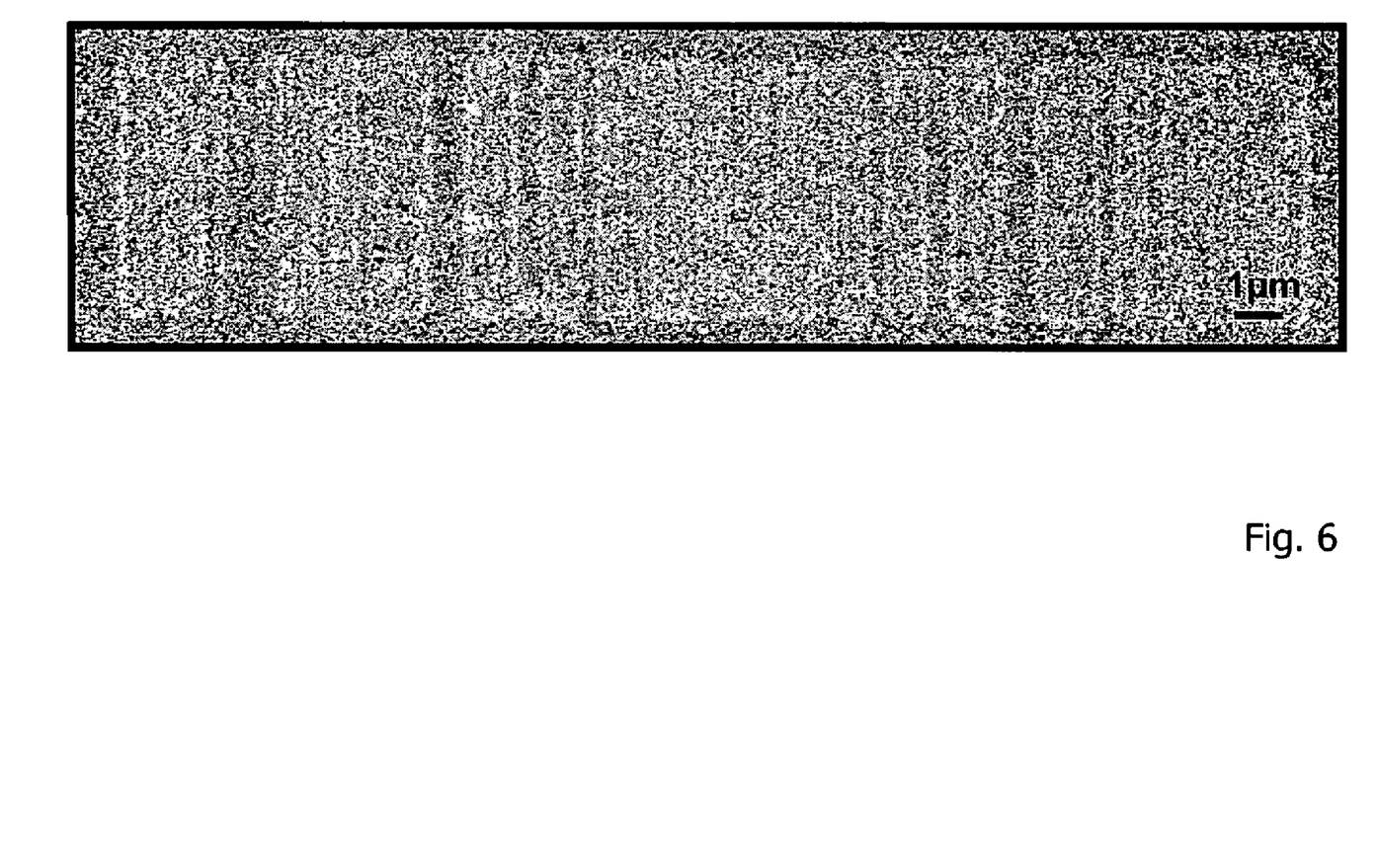
FIG. 6 shows a SEM image of octadecanthiol printed with Surlyn at 25 bar.

Like in Example 1 an experiment is performed with Surlyn 1702 applying a maximum pressure of 25 bar. Instead of using a cytochrome c solution an octadecanethiol (ODT) solution was used as ink. The SEM image (FIG. 6) shows that this transfer process leads to results that are comparable to conventional µCP process.

Example 5

Figure 7:
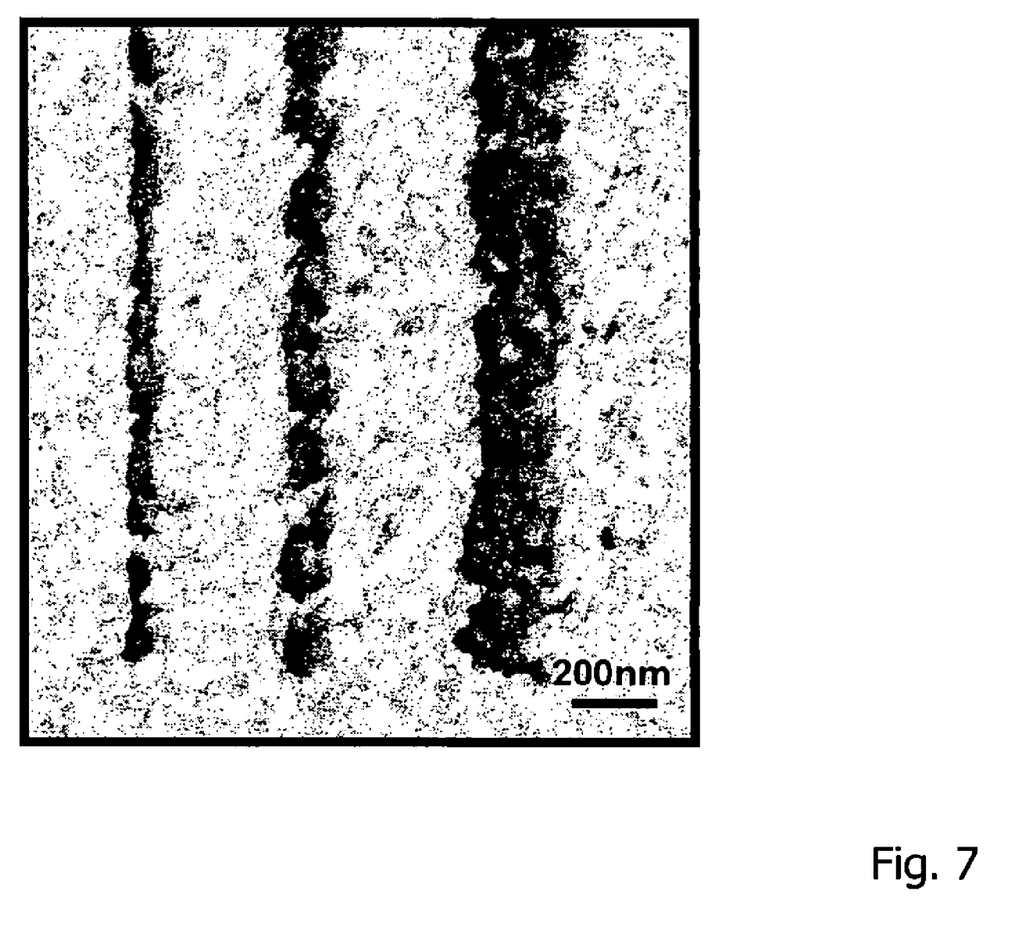
FIG. 7 shows a SEM image of cytochrome c printed with Plexiglas at 42 bar.

Like in Example 1 an experiment is performed. Instead of using Surlyn 1702 as stamp material Plexiglas 99530 was used. The SEM image (FIG. 7) shows that the transferred pattern is comparable to the patterns transferred with Surlyn.

Example 6

Figure 8:
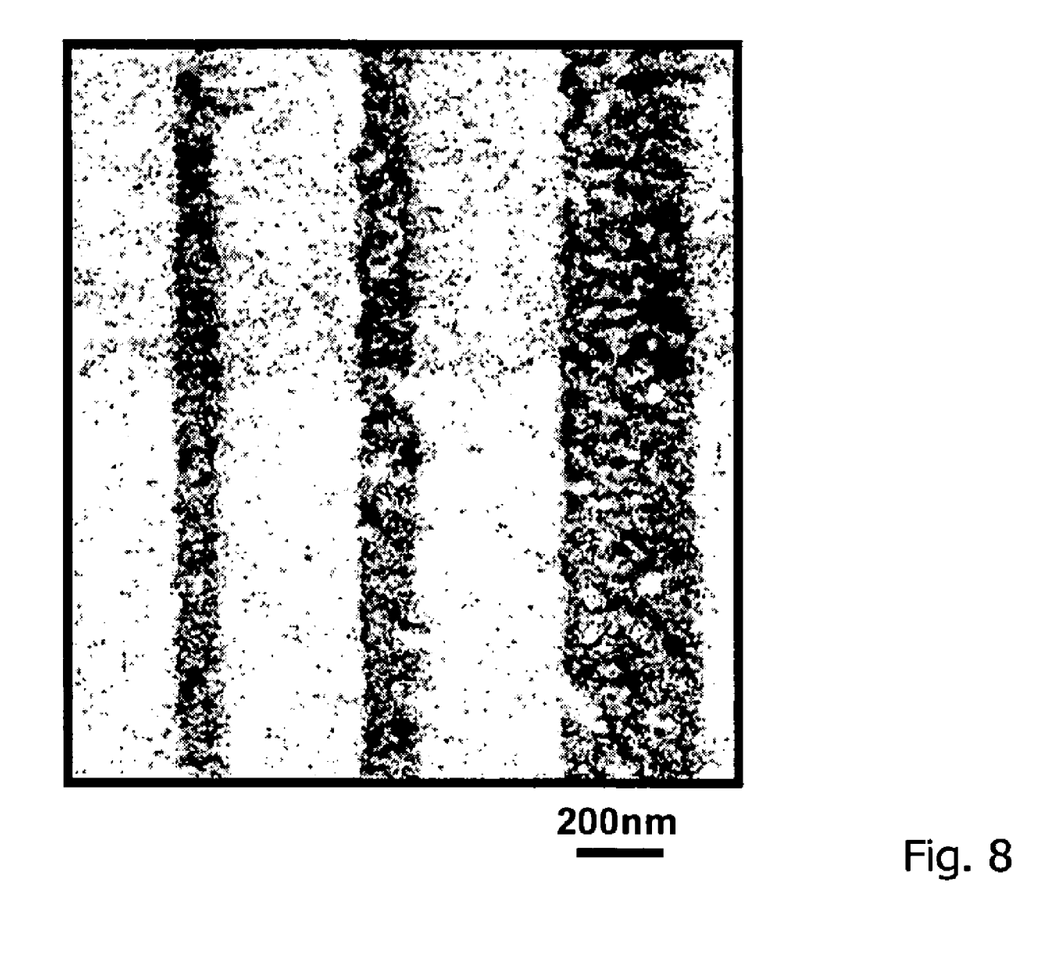
FIG. 8 shows a SEM image of cytochrome c printed with Zeonex at 42 bar.

Like in Example 1 an experiment is performed. Instead of using Surlyn 1702 as stamp materialZeonex E48R was used. The SEM image (FIG. 8) shows that the transferred pattern is comparable to the patterns transferred with Surlyn.

Example 7

Figure 9:
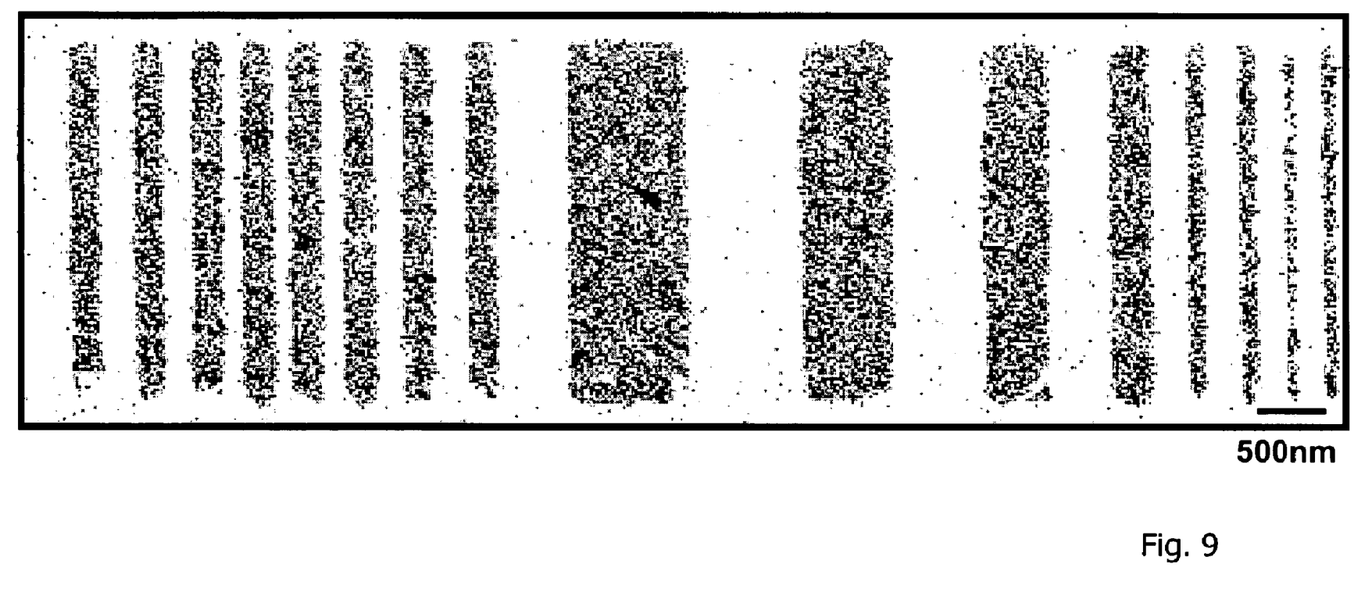
FIG. 9 shows a SEM image of cytochrome c printed with Topas at 42 bar.

Like in Example 1 an experiment is performed. Instead of using Surlyn 1702 as stamp material Topas 8007 was used. The SEM image (FIG. 9) shows that the transferred pattern is comparable to the patterns transferred with Surlyn.

Example 8

Figure 10:
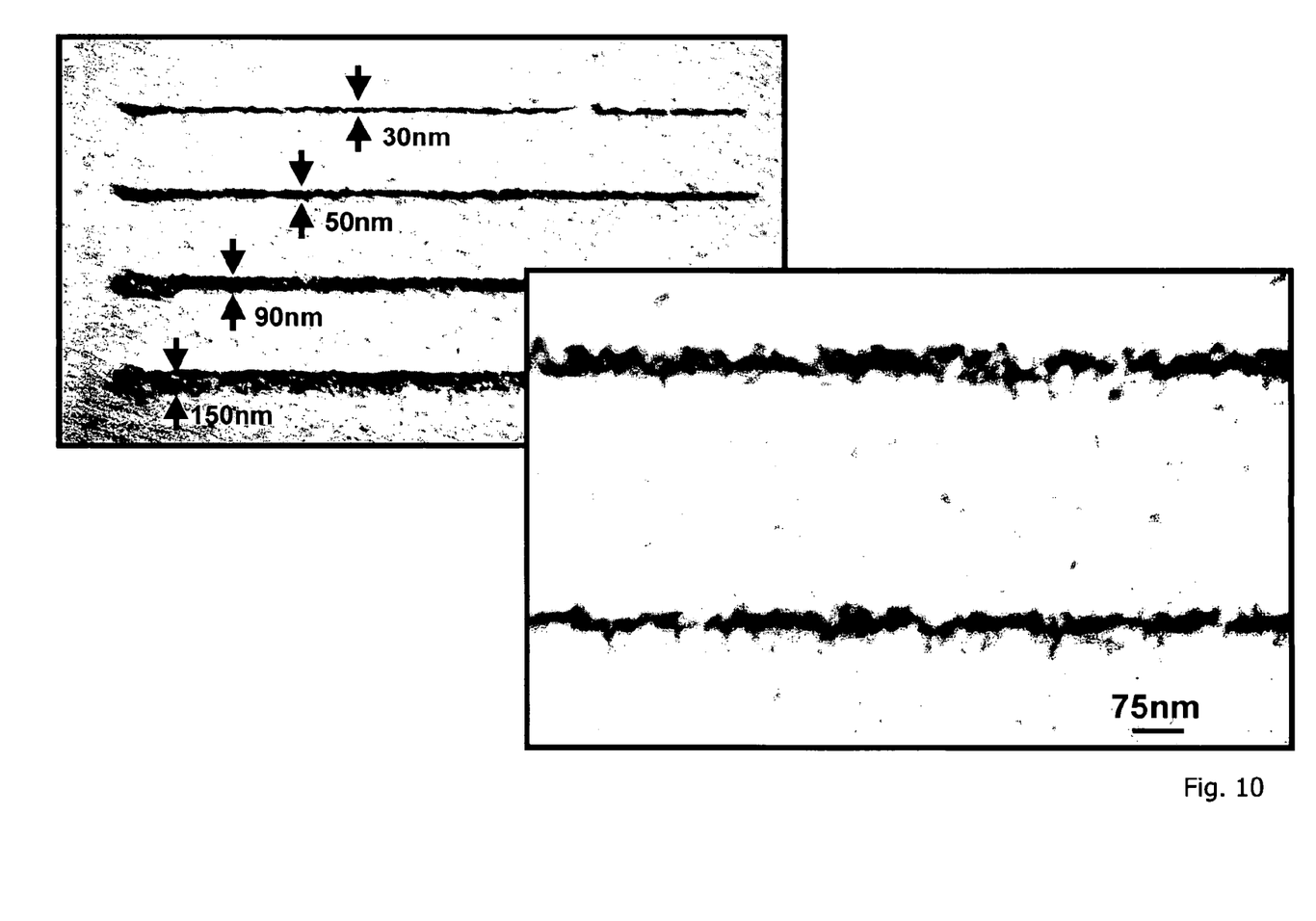
FIG. 10 shows a SEM image of cytochrome c printed with Topas having 25 nm patterns at 42 bar.
Figure 11:
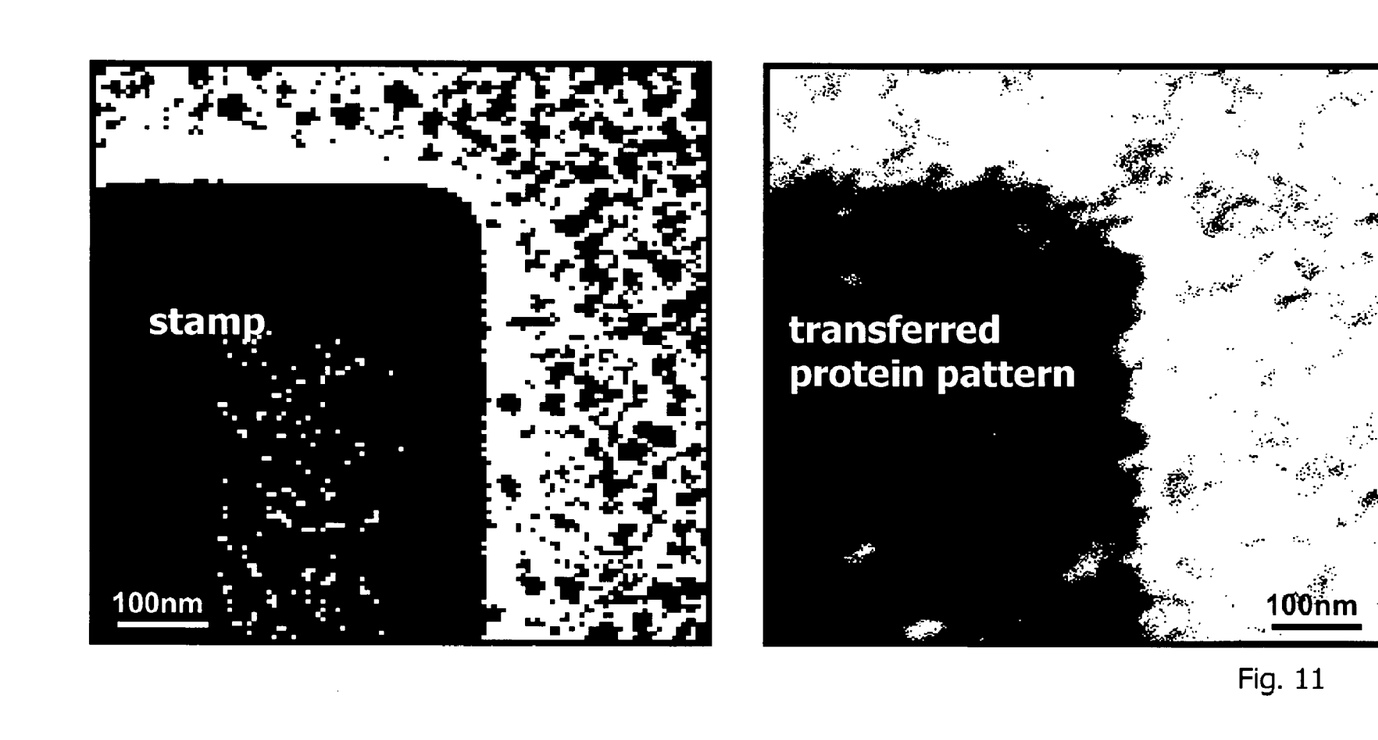
FIG. 11 shows a SEM image of cytochrome c printed with Topas with different dimensions.

Like in Example 7 an experiment is performed with Topas 8007 as stamp material. Instead of using patterns with 5 µm to 75 nm a design with patterns between 400 nm and 25 nm was used. The SEM image (FIG. 10) shows that the 25 nm were also transferred. The edge roughness that is apparent for the 25 nm thick line is mostly due to the structure of the underlying gold because the pattern follows the gold domains. A comparison with larger protein patterns and SEM images (FIG. 11) of the stamps edges reveals that the same edge roughness is present for large patterns, although the roughness of the stamps edges is much smaller.

The above described process allows the printing of molecules down to critical dimension≦30 nm with different hard stamp materials.

The main advantages of this process are:
1. The process can be carried out with different printing pressures.
2. The pressure can be precisely adjusted and even ramps with different pressure can be easily performed.
3. The process is scalable from small substrates and stamps up to 12 inch diameter.
4. The process allows the usage of very hard polymers, which allows the transfer of patterns with very critical dimensions ≦30 nm.
5. The process ensures uniform printing over large areas.
6. The process automatically ensures that the stamp can not move with respect to the substrate.
7. The polymeric stamps used in this process can be made in a single step and a simple to fabricate.
8. The process is defect-tolerant. A dust grain for example only causes a minor area of affected transfer.
9. The process does not have huge requirements on the uniformity of the three-dimensional stamp patterns. Fluctuations in the height for example can be compensated.
10. The process can be applied to various small pieces either of said first substrate, said second substrate or of both at the same time.

REFERENCES

1. Xia, Y.; Whitesides, G. M.; Annu. Rev. Mater. Sci. 28 (1998), 153-184.
2. Michel, B. et al.; IBM J. Res. & Dev. 45 (2001), 697-719.
3. Kumar, A.; Whitesides, G. M.; Appl. Phys. Let. 114 (1992), 9188-9189.
4. Bernard, A; Delamarche, E.; Schmid, H.; Michel, B.; Bosshard, H. R.; Biebuyck, H.; Langmuir 14 (1998), 2225-2229
5. Hui, C. Y.; Jagota, A.; Lin, Y. Y.; Kramer, E. J.; Langmuir 18 (2002), 1394-1407.
6. Schmid, H.; Michel, B.; Macromolecules 33 (2000), 3042-3049.
7. Csucs, G.; Künzler, T.; Feldman, K.; Robin, F.; Spencer, N. D.; Langmuir 19 (2003), 6104-6109.

8. Trimbach, D.; Feldman, K.; Spencer, N. D.; Broer, D. J.; Bastiaansen, C. W. M.; Langmuir 19 (2003), 10957-10961.
9. Loo, Y.-L., Willett, R. L. Baldwin, K. W., J. A. Rogers, Appl. Phys. Lett. (2002), 81, 562-564.
10. Loo et al., U.S. Pat. No. 6,946,332 B2.
11. Chou, S. Y.; U.S. Pat. No. 6,482,742
12. Tan, H.; Kong, L.; Li, M.; Steere, C.; Koecher, L.; SPIE's The International Society for Optical Engineering: Emerging Lithographic Technologies VIII 2004, 213-221.
13. X Nishi, Y. Handbook of semiconductor manufacturing technology, New York, N.Y.: Dekker, 2000
14. Y Levinson, H. J. Principles of lithography, Bellingham, Wash.: SPIE Press, 2001
15. Guo, Q.; Teng, X.; Yang, H.; Nano Lett. 4 (2004), 1657-1662.

The features of the present invention disclosed in the specification, the claims and/or in the accompanying drawings, may, both separately, and in any combination thereof, be material for realizing the invention in various forms thereof.

The invention claimed is:

1. A method of applying a material on a substrate, comprising the steps:
   a) providing a first substrate having a first surface,
   b) providing a second substrate having a second surface, said second substrate having a Young's modulus $\geq 100$ MPa,
   c) providing material, to be applied on said first surface, and applying said material on said second surface,
   d) producing an assembly of said first substrate and said second substrate by bringing said first surface in contact with said second surface, with said material being sandwiched between said surfaces, said assembly including a volume arranged between said first and said second substrate,
   e) applying first pressure conditions on said assembly thereby establishing first pressure conditions in said volume,
   f) sealing said volume, and
   g) applying second pressure conditions on said assembly, wherein said second pressure conditions involve a higher pressure than said first pressure conditions, such that said first surface is brought into conformal contact with said second surface, thereby applying said material on said first surface.

2. The method according to claim 1, further comprising the steps:
   h) applying third pressure conditions on said assembly, wherein said third pressure conditions are different to said second pressure conditions,
   i) unsealing said volume, and
   g) removing said second substrate from said assembly.

3. The method according to claim 1, wherein said providing the second substrate includes said second surface having a patterned surface that has a pattern of protrusions and/or recesses.

4. The method according to claim 1, wherein said applying second pressure conditions on said assembly is performed by means of a chamber configured to be evacuated and/or pressurized, wherein, for application of said second pressure conditions, said chamber is pressurized, whilst said assembly is located in said chamber.

5. The method according to claim 1, wherein said applying first pressure conditions includes applying atmospheric or ambient pressure, or a pressure below atmospheric or ambient pressure in a range of 0.1 mbar to 900 mbar.

6. The method according to claim 2, wherein said applying third pressure conditions includes applying atmospheric or ambient pressure or a pressure below atmospheric or ambient pressure.

7. The method according to claim 2, wherein said applying second pressure conditions includes second pressure conditions that involve a higher pressure than said first and third pressure conditions.

8. The method according to claim 7, wherein said applying first pressure conditions and said applying third pressure conditions includes first and third pressure conditions that are the same and involve atmospheric or ambient pressure or a pressure below atmospheric or ambient pressure.

9. The method according to claim 7, wherein said applying first pressure conditions and said applying third pressure conditions includes first and third pressure conditions that are not the same and said third pressure conditions involve a higher pressure than said first pressure conditions, and wherein said third pressure conditions involve atmospheric or ambient pressure and said first pressure conditions involve a pressure below atmospheric or ambient pressure.

10. The method according to claim 1, wherein said applying first pressure conditions includes applying a pressure below atmospheric or ambient pressure, and wherein said first pressure conditions are applied on said assembly by means of a chamber configured to be evacuated and/or pressurized, wherein, for application of said first pressure conditions, said chamber is evacuated, whilst said assembly is located in said chamber.

11. The method according to claim 10, wherein said applying second pressure conditions includes said chamber configured to be evacuated and/or pressurized, wherein, for application of said second pressure conditions said chamber is pressurized whilst said assembly is located in said chamber.

12. The method according to claim 2, wherein said applying third pressure conditions includes applying atmospheric or ambient pressure, and wherein said third pressure conditions are applied on said assembly by means of a chamber configured to be evacuated and/or pressurized, wherein, for application of said third pressure conditions, said chamber is evacuated to atmospheric or ambient pressure, whilst said assembly is located in said chamber.

13. The method according to claim 12, wherein said applying third pressure conditions includes said chamber configured to be evacuated and/or pressurized, wherein, for application of said third pressure conditions, said chamber is pressurized, whilst said assembly is located in said chamber.

14. The method according to claim 1, wherein said applying second pressure conditions includes applying a pressure higher than atmospheric pressure.

15. The method according to claim 14, wherein said applying second pressure conditions includes applying a pressure in a range of 2 bar to 100 bar.

16. The method according to claim 14, wherein said applying second pressure conditions is over a period of from 5 s to 60 min.

17. The method according to claim 14, wherein said applying second pressure conditions includes an increase of pressure up to a maximum pressure in a range of 2 bar to 100 bar.

18. The method according to claim 1, wherein said providing the second substrate includes said second substrate made of a material having a Young's modulus $\geq 100$ MPa and the material is selected from the group consisting of polymers, metals, semiconductors, crystals, amorphous solids and composites thereof.

19. The method according to claim 18, wherein said providing the second substrate includes said second substrate made of a polymer that is selected from the group consisting of polyolefines, ionomers, polymethylmethacrylates, polycarbonates, cellulose acetate, polyamide, polyimide, polystyrene, polytetrafluoroethylene, polyoxymethylene and co-polymers.

20. The method according to claim 1, wherein said providing the first substrate includes said first substrate made of a material having a Young's modulus ≧100 MPa and the material is selected from the group consisting of polymers, metals, semiconductors, crystals and composites thereof.

21. The method according to claim 20, wherein said providing the first substrate includes said first substrate made of a polymer that is selected from the group of thermosetting plastics consisting of polyolefines, ionomers, polyethylene-methacrylate-copolymers, polymethylmethacrylate, polycarbonates, cellulose acetate, polyamide, polyimide, polystyrene, polytetrafluoroethylene, polyoxymethylene and copolymers.

22. The method according to claim 1, wherein said sealing occurs by applying a sealing material to said assembly of said first substrate and said second substrate, to enclose said volume between said first and said second substrate and to isolate said volume from the surroundings of said assembly.

23. The method according to claim 22, wherein said sealing includes applying said sealing material that is a sealing ring or a foil enclosing said assembly, or two foils enclosing said assembly.

24. The method according to claim 1, wherein said applying second pressure conditions is at a temperature in a range of 0° C. to 200° C.

25. The method according to claim 1, wherein steps a) and b) occur in the order ab or ba, or they occur concomitantly.

26. The method according to claim 1, wherein said material, to be applied on said first surface, is selected from the group comprising molecules such as organic molecules, metal complex compounds, proteins; thin films of inorganic solids, nanoparticles, wherein, said inorganic solids are selected from the group comprising metals, metal oxides, semiconductors and insulators; and objects such as viruses.

27. The method according to claim 1, wherein said material, to be applied on said first surface, is applied on said second surface by a process selected from contact inking and wet inking.

28. The method according to claim 1, wherein said applying first pressure conditions includes applying atmospheric or ambient pressure, or a pressure below atmospheric or ambient pressure in a range of 100 mbar to 500 mbar.

29. The method according to claim 14, wherein said applying second pressure conditions includes applying a pressure in a range of 2 bar to 42 bar.

30. The method according to claim 14, wherein said applying second pressure conditions includes an increase of pressure up to a maximum pressure in a range of 2 bar to 42 bar.

31. The method according to claim 1, wherein said applying second pressure conditions is at a temperature in a range of 0° C. to 95° C.

* * * * *